United States Patent [19]

Kirkpatrick

[11] Patent Number: 5,082,359
[45] Date of Patent: Jan. 21, 1992

[54] DIAMOND FILMS AND METHOD OF GROWING DIAMOND FILMS ON NONDIAMOND SUBSTRATES

[75] Inventor: Allen R. Kirkpatrick, Lexington, Mass.

[73] Assignee: Epion Corporation, Bedford, Mass.

[21] Appl. No.: 442,121

[22] Filed: Nov. 28, 1989

[51] Int. Cl.$^5$ .................. C23C 16/18; C23C 16/46; C23C 16/48; C23C 16/50
[52] U.S. Cl. .................. 359/642; 427/38; 427/39; 427/45.1; 427/249; 427/307; 427/309; 427/162; 423/446; 428/408; 264/81
[58] Field of Search .................. 427/38, 39, 45.1, 249, 427/307, 309; 423/446; 428/408; 264/81; 350/409

[56] References Cited

U.S. PATENT DOCUMENTS

| | | | |
|---|---|---|---|
| 4,412,980 | 11/1983 | Tsuji et al. | 423/446 |
| 4,490,229 | 12/1984 | Mirtich et al. | 423/446 |
| 4,632,817 | 12/1986 | Yazu et al. | 423/446 |
| 4,734,339 | 3/1988 | Schachner et al. | 428/701 |
| 4,767,517 | 8/1988 | Hiraki et al. | 204/192.25 |
| 4,816,291 | 3/1989 | Desphandey et al. | 427/38 |
| 4,822,466 | 4/1989 | Rabalais et al. | 204/192.15 |
| 4,884,785 | 7/1989 | Kitabatake et al. | 204/192.11 |
| 4,919,974 | 4/1990 | McCune et al. | 427/249 |
| 4,925,701 | 5/1990 | Jansen et al. | 427/45.1 |

FOREIGN PATENT DOCUMENTS

| | | |
|---|---|---|
| 61-121859 | 6/1986 | Japan . |
| 1-018991 | 1/1989 | Japan . |
| 1-203293 | 8/1989 | Japan . |

OTHER PUBLICATIONS

Hirabayashi et al., Appl, Phys. Lett. 53 (19) pp. 1815-1817 (Nov. 7, 1989).
Ma et al., Appl. Phys. Lett 55 (11) pp. 1071-1073 (Sep. 11, 1988).
Geis, Appl. Phys. Lett., 55 (6) pp. 550-552 (Aug. 7, 1989).
Bachmann et al., Chemical and Eng. News 67 (20) pp. 1-58 (May 15, 1989).
Angus et al. MRS Bulletin pp. 38-47 (Oct. 1989).

*Primary Examiner*—Norman Morgenstern
*Assistant Examiner*—Margaret Burke
*Attorney, Agent, or Firm*—Thomas J. Engellenner; William C. Geary, III

[57] ABSTRACT

A method of forming a polycrystalline film, such as a diamond, on a foreign substrate involves preparing the substrate before film deposition to define discrete nucleation sites. The substrate is prepared for film deposition by forming a pattern of irregularities in the surface thereof. The irregularities, typically craters, are arranged in a predetermined pattern which corresponds to that desired for the location of film crystals. The craters preferrably are of uniform, predetermined dimensions (in the sub-micron and micron size range) and are uniformly spaced apart by a predetermined distance. The craters may be formed by a number of techniques, including focused ion beam milling, laser vaporization, and chemical or plasma etching using a patterned photoresist. Once the substrate has been prepared the film may be deposited by a number of known techniques. Films prepared by this method are characterized by a regular surface pattern of crystals which may be arranged in virtually any desired pattern. Diamond film materials made by this technique may be used in many electrical, optical, thermal and other applications.

33 Claims, 5 Drawing Sheets

DIAMOND FILMS AND METHOD OF GROWING DIAMOND FILMS ON NONDIAMOND SUBSTRATES

The U.S. Government has the right to a paid-up license in this invention as provided in the terms of Contract No. DASG 60-89-C-0035.

REFERENCE TO RELATED DOCUMENT

This application is related to Disclosure Document No. 228,921, filed June 5, 1989.

BACKGROUND OF THE INVENTION

This invention relates to techniques for growing films, particularly diamond films, on foreign substrates, and the films and products prepared from such techniques.

Thin films of diamond are known to have great potential for use in a variety of applications due to their exceptional mechanical, thermal, optical and electronic properties. For example, diamond films can be used as semiconductors, transitors, heat sinks, optical coatings, optical devices, electronic devices, as coatings for drill bits and cutting tools, and as inert coatings for prosthetics. Unfortunately, as presently deposited by known techniques on nondiamond (foreign) substrates, diamond films are characterized by highly disordered polycrystalline structures which can cause them to be incompatible with many prospective applications. For applications to electronic devices where semiconducting diamond films on foreign substrates such as silicon could offer extraordinary advantages, the problems are particularly serious. Unless microstructure and morphology are substantially improved, it may be difficult or impossible to utilize polycrystalline diamond films in practical electronic devices.

A major factor involved with the disordered microstructure of conventional diamond films grown on nondiamond substrates is that such films are characterized by very low nucleation densities. For example, the nucleation density when diamond is deposited on a polished silicon surface is typically less than $10^4$ per $cm^2$ ($10^{-4}$ per square micron)—many orders of magnitude less than that exhibited by most materials.

As a result, diamond film growth procedures often employ substrate preparation techniques in an attempt to increase the nucleation density to a practicable level. Such techniques typically involve introduction of surface discontinuities by scratching or abrading the surface of the substrate with a polishing or grinding material usually a diamond paste or powder. Such surface discontinuities are believed to create preferential sites for diamond crystal nucleation. Or, embedded residues from the diamond paste or powder may serve as sites at which diamond growth can occur by accumulation.

Despite such surface preparation techniques, the nucleation densities for diamond films prepared by such techniques remain low—approximately $10^8$ per $cm^2$ (1 per square micron). Moreover the surface structure of these films is unpredictable, and they typically exhibit very disordered surface patterns. For these reasons such films often are not useful in many applications where diamond films are theoretically well suited.

It is thus an object of the invention to provide a method of growing quality, polycrystalline films of diamond and other materials upon foreign substrates. A further object of the invention is to provide a method of treating substrate materials so as to increase the nucleation density of films such as diamond. Another object of the invention is to provide a method of growing, on nondiamond substrates, diamond films having a regular and predictable crystal microstructure. It is also an object of the invention to provide quality diamond films in which the growth initiation sites of the film may be predetermined and specified. Other objects of the invention will be apparent upon reading the following disclosure.

SUMMARY OF THE INVENTION

According to the invention, polycrystalline films (such as diamond) of good quality having a regular and predictable crystal structure may be grown upon foreign substrates. The substrates, such as single crystal polished silicon wafers and other known materials, are prepared for deposition by specifying the growth initiation sites of the film. This is accomplished by forming in a surface of the substrate, in a predetermined pattern, a multitude of submicron to micron sized discontinuities or craters. The craters typically are (but are not required to be) formed of uniform dimensions and are uniformly spaced apart. The craters, which preferably have diameters ranging from less than 0.1 $\mu m$ (e.g. 0.05 to 0.09 $\mu m$) to about 10 $\mu m$, may be formed by any one of a number of known techniques, including focused ion beam ("FIB") milling (sputtering), laser vaporization, and chemical or plasma etching using a patterned photoresist. The density of craters formed by these techniques ranges from more than $10^9$ per $cm^2$ to less than $10^4$ per $cm^2$.

Once the craters are formed they are seeded with a natural or synthetic diamond material, such as diamond particles of submicron dimensions (e.g. 0–0.25 $\mu m$) or sizes up to a few microns. The diamond seed particles typically are suspended in a solution (e.g. an alcohol, oil or soap solution) which is applied to the cratered substrate. The diamond seeds are left in the craters as the solute evaporates or as the seeds settle due to gravitation. If necessary, the substrate can be agitated to facilitate the placement of at least one seed particle in each crater. Any remaining solution is then evaporated or otherwise removed. If desired, subsequent cleaning operations can be employed to remove spurious diamond seed particles, i.e., those which are present on the substrate, but not disposed within a crater. The diamond film then can be deposited by a variety of well known deposition techniques such as filament-assisted chemical vapor deposition ("CVD"), DC plasma CVD, microwave plasma CVD or oxyacetylene flame deposition. Growth initiates on the diamond seeds without the need for any real nucleation to occur. As this diamond growth progresses the film attaches to and envelopes the substrate material in the immediate vicinity of each seed crater.

The films produced by the techniques of this invention are characterized by a controllable and regular crystal microstructure and morphology, and are of such quality as to enable them to be used in a variety of applications, including tools as well as electronic, optical and medical devices. The films can be grown to thicknesses ranging from less than 1 $\mu m$ to more than 100 $\mu m$. Moreover, the density of crystals which make up the film deposited on the substrate may be controlled so that the distance between crystals may be varied from a continuous film having merged or coalesced crystals to one having discrete crystals spaced apart by less than 1 to 100 μm or more. The crystals can range in diameter from less than 0.1 μm to a size about equal to the spacing between the craters.

The film growing techniques of this invention are generally discussed with respect to diamond films. However, the technique of the invention can be utilized to grow films comprised of materials other than diamond.

DETAILED DESCRIPTION OF THE INVENTION

Figure 1:
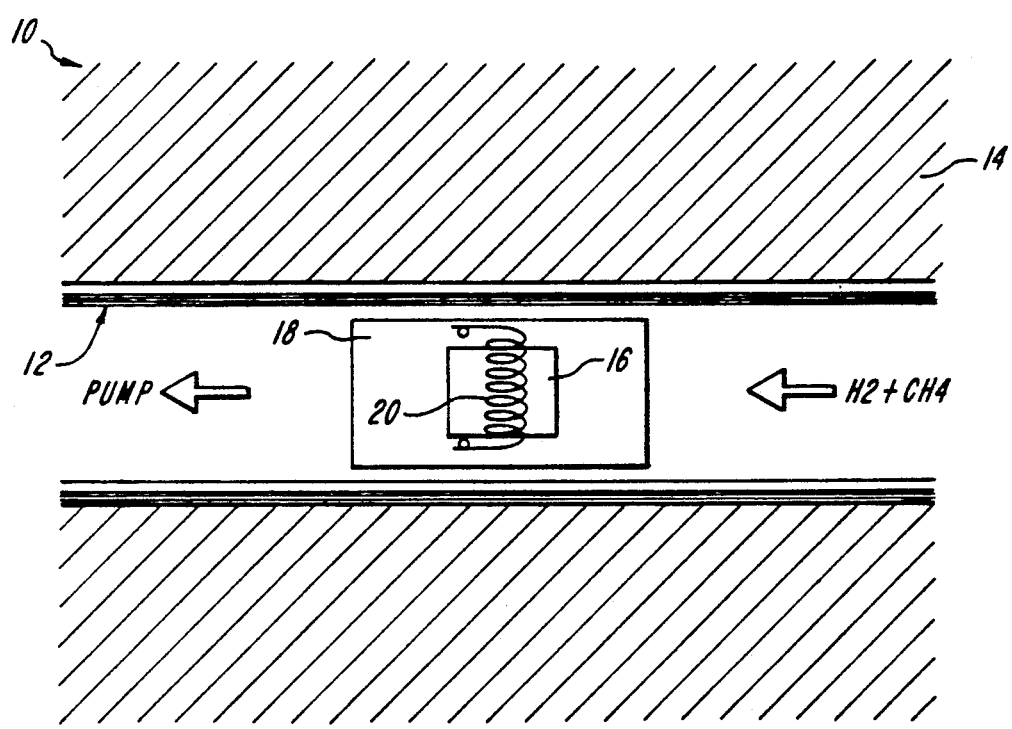
FIG. 1 is a schematic illustration of an apparatus used for filament-assisted CVD.

The invention enables the preparation of polycrystalline films of diamond and other materials, deposited on foreign substrates (i.e., substrates of a material different than that of the film) of sufficient quality to be commercially useful. These films are characterized by a controllable and ordered crystal microstructure and morphology. That is, the individual sites at which film growth is initiated may be specified, thus allowing one to control crystal location, spacing and size. Such films have a crystal structure in which the crystal size may vary and be controlled to range between less than 0.1 μm to as high as 100 μm or more. Preferably, the crystals which make up the film are substantially uniform in size. Moreover, the crystals may be grown to varying degrees of density such that they become coalesced or are spaced apart by predetermined intervals as little as less than 1 micron and as much as 100 or more microns. The regular crystal structure of such films and the virtual absence of any unwanted surface voids are distinct advantages of such films.

The method of this invention facilitates the growth upon foreign substrates of such high quality polycrystalline films as diamond. It has been discovered that quality films with predictable and ordered crystal microstructure and morphology are obtained through the method of this invention due to the ability to increase the effective nucleation density and to specify the individual film growth sites on the substrate. The improved crystal structure and regularity is particularly noticeable for diamond films which are grown on non-diamond substrates.

According to the invention, the increase in effective nucleation density and the ability to predetermine sites at which growth initiates results in crystal regularity and hence a desirable film microstructure and morphology. A key factor in controlling the growth of films on foreign substrates is control over the nucleation phase of the growth process. Effective nucleation sites may be individually specified by treating a substrate material, prior to film deposition, to form minute (submicron to micron sized) discontinuities or craters in the surface of the substrate and then introducing seeds of the film material into these craters. The seeded craters serve as effective nucleation sites for the film and they may be arranged in virtually any pattern and at densities ranging from about $10^4$ per $cm^2$ to about $10^{10}$ per $cm^2$. In fact, growth may initiate on a seed by accumulation without any true nucleation occurring.

The invention is particularly applicable to the growth of diamond films and is also useful for growing a variety of other polycrystalline films, particularly those materials or growth processes in which nucleation, or effective nucleation, occurs only with difficulty. Exemplary materials, in addition to diamond, to which this invention may be applicable include, germanium, silicon, gallium arsenide, and others typically used in semiconductor applications. In addition, the films may be deposited upon a number of substrate materials. One currently preferred substrate material (especially for diamond films) is a polished wafer of single crystal silicon of the type used in the semiconductor industry. Other examples of useful substrate materials include titanium, molybdenum, nickel, copper, tungsten, tantalum, steel, ceramic, silicon carbide, silicon nitride, silicon aluminum oxynitride, boron nitride, alumina, zinc sulfide, zinc selenide, tungsten carbide, graphite, fused silica, glass, and sapphire.

Generally, the films may be prepared according to the method of the invention in the following manner. First, a substrate material, such as a polished silicon wafer or another known substrate material is obtained. The substrate is then prepared for diamond film deposition by specifying the individual film growth initiation sites at a selected density between $10^4$ and $10^{10}$ sites per $cm^2$. This is accomplished by forming a plurality of microscale surface structures (e.g., craters) to act as film nucleation sites, in a predetermined pattern, in the surface of the substrate. Next, all or substantially all of the surface structure sites are seeded with at least one minute diamond particle, smaller in size than the site itself. Following seeding, a film may be deposited upon the substrate by any one of a number of known deposition methods including filament-assisted chemical vapor deposition ("CVD"). Diamond film deposition is terminated after a predetermined amount of time (ranging from a few minutes to hundreds of hours) after a sufficient and desired amount of diamond film has been grown. The film may then be evaluated for diamond quality and post-treated to improve surface quality or characteristics.

The growth initiation sites (hereinafter "craters") may be formed by techniques which are suitable to make minute surface depressions in the substrate in a predetermined pattern. Such techniques include focused ion beam ("FIB") sputtering techniques, laser vaporization of the substrate, chemical or plasma etching techniques using a patterned photoresist, or similar techniques. In some application, FIB milling is a preferred crater forming technique due to the ability to form a precise, predetermined pattern of very small craters having desired and uniform dimensions which are spaced apart from each other by less than 1 μm. Moreover, FIB sputtering enables crater dimensions to be varied and depth to be controlled by using ion dosages between about 0.01 to 1.28 nanocoulomb/$\mu m^2$ when working with silicon substrates. The dosages may vary, and may be outside of this range, depending upon the substrate and FIB equipment used.

An example of a suitable FIB unit for use by this invention is one which produces a 25 KeV Ga+ beam which can be focused at the surface of the substrate to a diameter of less than 0.1 μm. One such apparatus is a Micrion 808 FIB system available from Micrion Corporation of Beverly, Mass.

The craters may be formed in virtually any predetermined pattern or array, depending upon the requirements of a given application and the limitations of the cratering technology which is employed. Preferably, the craters are formed in a density ranging from about $10^4$ to $10^{10}$ craters per square centimeter. The most preferred crater density is about $10^7$ to $10^9$ craters per square centimeter depending upon the desired film characteristics. Generally, the depth of the craters is approximately 0.02 μm to several microns and most preferably about 0.1-2 μm. In any event, the craters are typically at least as deep as they are wide, however the depth may exceed the crater diameter.

Crater shape is not critical, but generally round craters are conveniently produced. The craters are generally round (although crater shape is not critical) and the crater diameter is variable and dependent upon the requirements of a given application. Crater diameter may range from less than about 0.1 to about 5 or more microns. Most preferably the crater diameter is in the range of about 0.1 to 2.0 μm. Moreover, the craters may be aligned in virtually any desired pattern. Among the currently preferred arrangements are orthogonal and hexagonal patterns. In an orthogonal pattern, the craters are arranged in vertical columns and horizontal rows. In a hexagonal pattern, a central crater is surrounded by six craters which are circumferentially spaced around the central crater at equal radial distances. Hexagonal patterns can be preferred where a surface structure in which the individual diamond crystals coalesce into a continuous film is desired. The craters arranged in hexagonal patterns typically are spaced apart by intervals ranging from about 0.2 to 100 or more microns. The spacing requirements will, of course, vary depending upon the requirements of a given application. However, a generally preferred spacing is 1 μm or less for films which are to be continuous and 1 μm or more for structures which are to consist of fields of isolated diamond crystals.

The craters are seeded with a diamond material by depositing at least one minute diamond seed particle (smaller in size than the crater) within all or substantially all of the craters. Preferably, the diamond seed material is a natural diamond particle or a quality synthetic diamond material. An example of a preferred synthetic diamond material is General Electric #300S Synthetic Diamond. Such seed material is commercially available from General Electric Company of Schenectady, N.Y. in a variety of sizes such as 0 to 0.25 μm and 0.25 μm to 0.5 μm. Among the preferred size ranges are those which are sufficient to occupy approximately one-third to one-half of the crater volume. Typically, the most preferred seed materials are those with a grain diameter between 0 and 0.25 μm.

The diamond seed particles may be deposited within the craters by techniques which ensure that all or substantially all of the craters are occupied by at least one diamond seed particle. One preferred seeding technique is to suspend a quantity of diamond seed materials in a liquid such as isopropyl alcohol. Examples of preferred solutions include alcohols, oils, water and soap solutions. The seed material suspension may be applied to the substrate by a variety of techniques including pouring, spraying, brushing or otherwise applying the suspension to the substrate, or by immersing the substrate in the suspension.

An example of a preferred suspension is one which contains approximately 0.1 to 0.5 grams of 0 to 0.25 μm grain diameter diamond powder in approximately 100 ml of an alcohol solution such as isopropyl alcohol. The suspension is thoroughly mixed or agitated before application to the substrate to ensure that the diamond particles are dispersed throughout the solution. The suspension is then applied to the substrate using a pipette, an eyedropper, a brush, or by immersing the substrate in the suspension. This step results in seed particles being deposited across the surface of the substrate and within the craters formed in the substrate. The placement of seeds within the craters may be improved by vibrating or agitating the substrate after the suspension is applied. Multiple applications of the seeding suspension can be conducted, if necessary, or desirable to ensure complete seeding. Eventually, the alcohol or other solution which is used to form the suspension may be removed by blot-drying or by evaporation, leaving the diamond particles distributed within the craters and upon the surface region of the substrate.

Diamond particles remaining on the surface of the substrate, but not within craters, can be removed if desired by various cleaning procedures such as flushing the substrate with an alcohol or other solution, ultrasonic cleaning of the substrate in a bath of alcohol (such as isopropyl alcohol), by wiping the substrate with alcohol-saturated absorbent materials such as cotton, or by combinations of these methods. During this substrate cleaning process if properly performed, the diamond seeds remain securely within their craters where they are not contacted by the flowing solutions or wiping materials.

The liquid used to suspend the diamond seed particles can be virtually any oil, soap, alcohol or agueous solution. One skilled in the art will easily be able to choose a desired solution considering such factors as wettability, rapidity of evaporation, ease of cleaning, cost and safety.

Various diamond film deposition techniques are now well known, and any one of a variety of such techniques may be utilized to deposit diamond film upon the cratered and seeded substrates. Exemplary diamond film growth techniques are disclosed in S. Matsumoto et al, *Jpn. J. Appl. Phys.*, 21 L183 (1982); N. Setaka et al *Res.* 4, No. 3, 664 (1989); and J. P. Angus et al, *MRS Bulletin*, pp. 38–47, October 1989, all of which are hereby incorporated by reference.

By way of example, one preferred technique of diamond film deposition is by filament-assisted chemical vapor deposition (CVD). An apparatus 10 which may be used for filament-assisted CVD of diamond film is illustrated in FIG. 1. With reference to FIG. 1, this deposition technique is conducted at low pressure within a closed quartz tube 12 which itself is contained within a high temperature tube furnace 14. Substrate wafers 16 typically are horizontally oriented and placed on a boron nitride plate 18 in close proximity to a hot spiral filament 20, preferably constructed of a tungsten wire having a diameter of about 0.010 inch. A high purity methane gas diluted with hydrogen gas is introduced into the tube 12 so as to flow over the filament 20 and the substrate 16. Any gases remaining within the tube may be pumped out of the tube by a mechanical vacuum pump (not shown). The ratio of methane to hydrogen gas, as is well known in the art, may vary between about 0.4:99.6 to about 5.0:95. Exemplary conditions for the deposition reaction include a furnace temperature between about 700° to about 1050° C., a filament current of about 7 to about 9 amps, filament-sample spacing from about 2 to about 15 mm, total gas flow ranging between 30 to 100 sccm, pressure ranging from about 20 mB to 120 mB. Typically the deposition time ranges between about 30 minutes to hundreds hours, with a diamond film growth rate in the range of about 1 micron per hour. The currently preferred deposition parameters are furnace temperature 850° C.; tungsten filament diameter of 0.010 inch; filament current 8.0 amps; filament—sample spacing 6 mm; methane/hydrogen ratio 3.5/96.5; total gas flow 30 sccm; and pressure of 100 mB.

The filament-assisted CVD method is only one of the techniques which may be utilized to grow the diamond films of the present invention. Virtually any of the several known diamond growth techniques may be used to produce such a film. Other such diamond growth deposition techniques include, but are not limited to, DC plasma CVD, microwave plasma CVD and oxyacetylene flame deposition.

The diamond films of this invention, as noted above, are quality diamond films which have all of the characteristics of diamond including hardness, wear resistance, low coefficient of friction, chemical resistance and which are electrically insulating or semiconducting. In addition, such materials have excellent acoustic, optical and thermal properties. As a result, the diamond films prepared according to this invention may be used in a variety of applications. One such application for these materials is for use as semiconducting and other electronic devices. However, these materials are also useful as abrasive, wear-resistant, coatings for blades, drills, cutting devices and other tools, coatings for bearings and glass elements, coatings for prosthetic devices, heat sinks and transparent windows and lenses for lasers, X-ray equipment and such other devices. Those skilled in the art will appreciate the many additional applications in which the diamond films of this invention may be used.

A potentially useful application of the diamond films of this invention is for use as lenses or windows in optical applications. In such applications it may be necessary to remove the substrate from the film by known techniques such as mechanical or chemical separation or ion beam etching.

Figure 2:
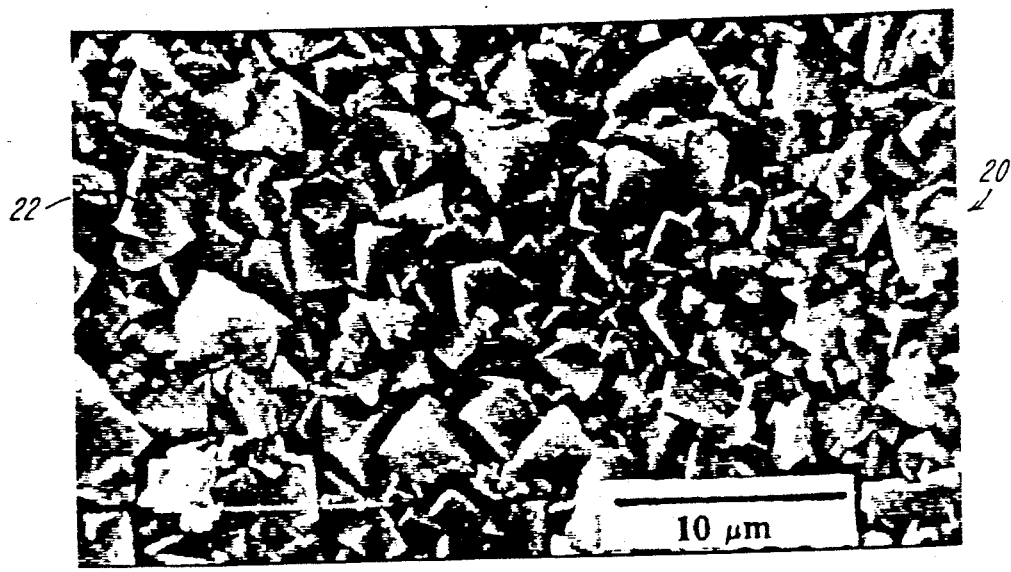
FIG. 2 is a photograph illustrating a diamond film produced according to a representative prior art method.

FIG. 2 is a photograph from a scanning electron microscope of a polycrystalline diamond film produced according to a typical prior art method in which a substrate 20 is prepared for diamond film growth by randomly scratching the substrate with a diamond paste or powder. The resulting growth of diamond crystals 22 is random and the film contains a number of surface voids. Due to the random crystal growth, crystals are often formed upon each other, sometimes forming bridges over areas (voids) at which growth does not occur. Due to the presence of such voids and the random crystal orientation, such films are not of sufficient quality to have utility for many commercial applications, such as in semiconductor devices.

Figure 3:
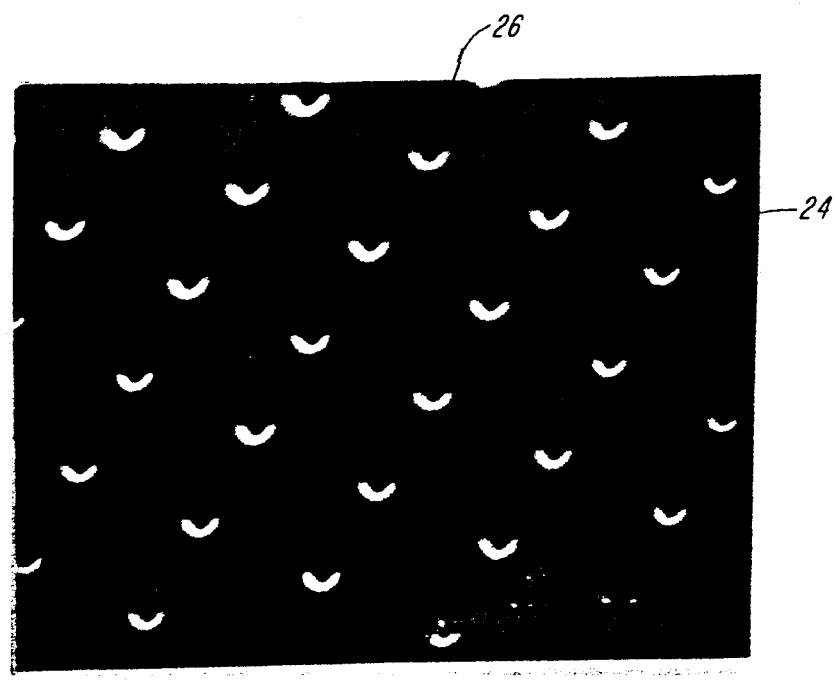
FIG. 3 is a photograph of a silicon substrate having craters formed therein in an orthogonal pattern.

FIG. 3 is a photograph from a scanning electron microscope of a silicon substrate 24, having formed in its surface a variety of craters 26, arranged in an orthogonal pattern. The craters 26 have a depth estimated to be roughly 0.2 $\mu m$ and a diameter of about 0.1 $\mu m$. The craters 26 are spaced apart from each other by about 1 micron. These craters were formed using FIB sputtering with a 25 keV Ga+ beam at a dose of 0.16 nanocoulomb/$\mu m^2$.

Figure 4:
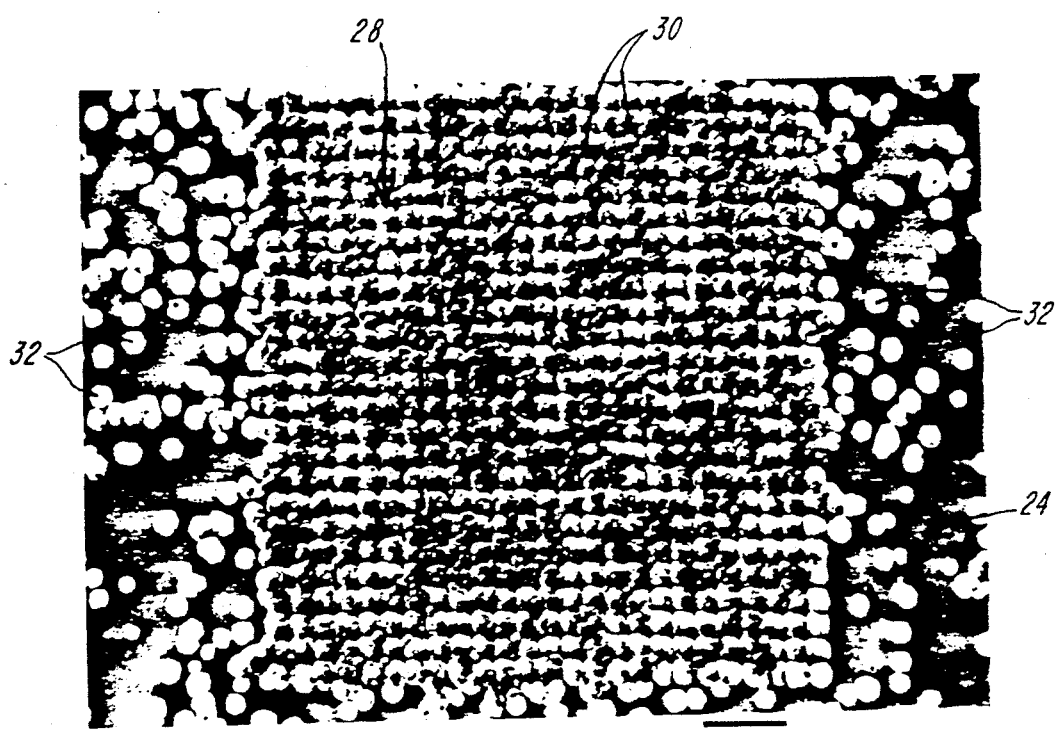
FIGS. 4 through 7 are photographs of diamond films grown on nondiamond substrates according to the method of the present invention.

FIGS. 4 through 7 illustrate diamond films formed according to the present invention on nondiamond substrates in which the growth of diamond film is initiated in diamond-seeded craters formed in the substrate. The photograph of FIG. 4 represents an approximately 100 $\mu m$ wide field of a substrate 24 having a diamond film 28 grown thereon. The film 28 comprises a multitude of individual diamond crystals 30, grown in an orthogonal pattern, such that the crystal growth is initiated within an orthogonal array of 25×25 seeded craters (not shown) of the type illustrated in FIG. 3. The field in the photograph represented by FIG. 4 is just one small section of the substrate (approximately 1 cm×1 cm) upon which the film is grown. Spurious crystals 32 are unwanted crystals which originate from diamond seed particles (not shown) which were not disposed within craters and are present due to insufficient post-seeding cleaning of the substrate. Sufficient post-seeding cleaning operations eliminates such unwanted crystal growth. Each crystal 30 of the film 28 shown in FIG. 4 is approximately 3 microns in diameter. The crystals of FIG. 4 have almost coalesced into a continuous film as would have resulted if a longer deposition period had been utilized.

Figure 5:
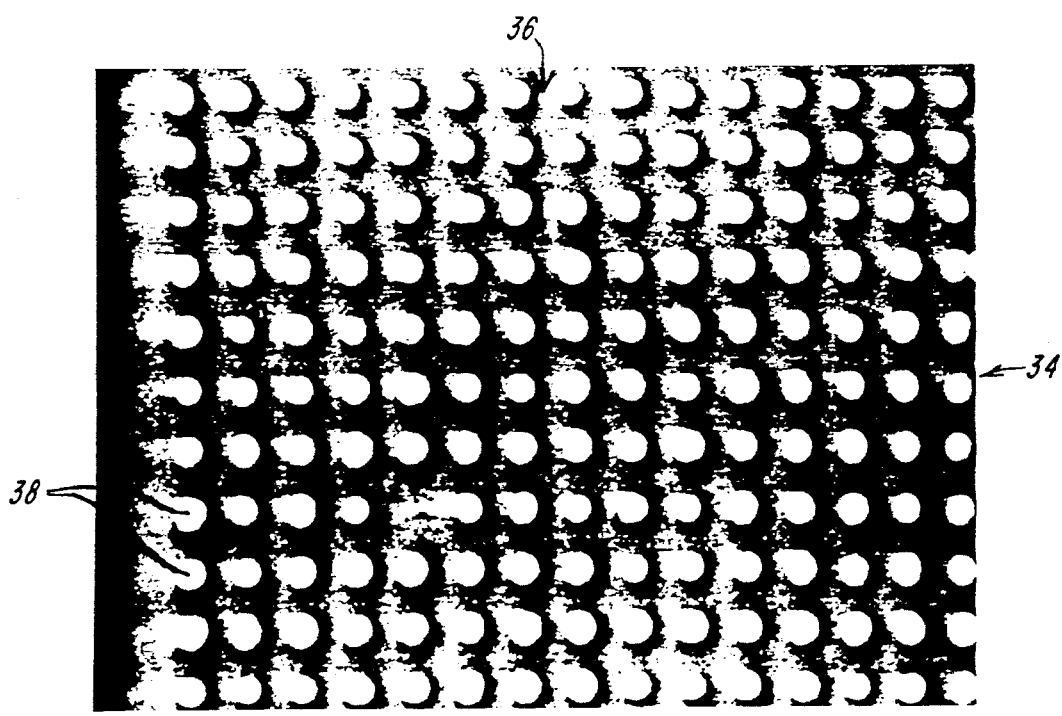
Figure 6:
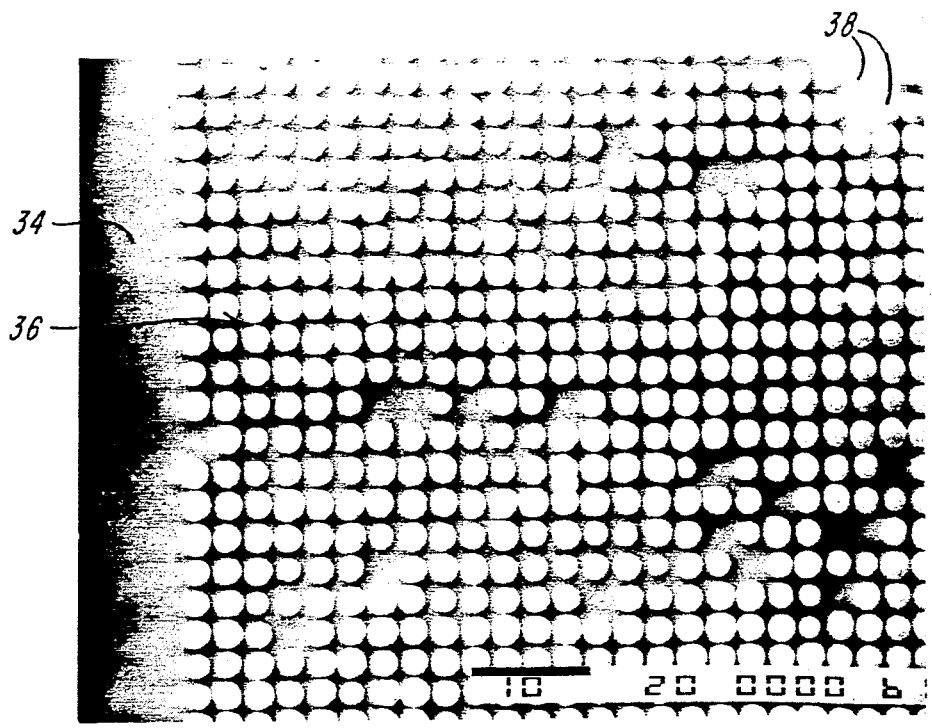
Figure 7:
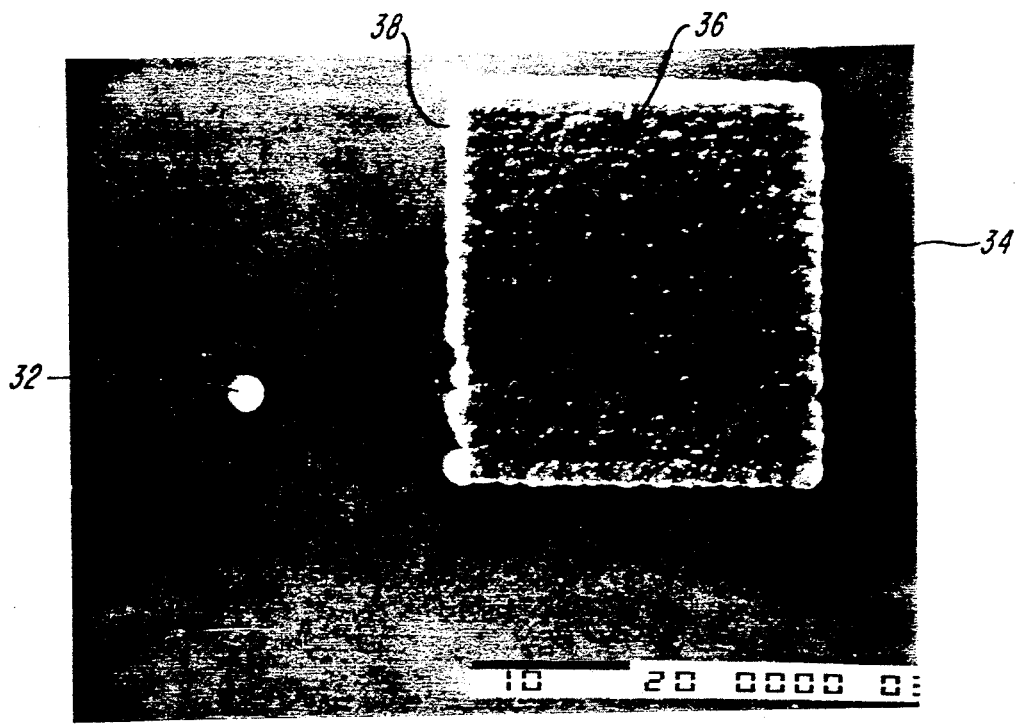
Figure 8:
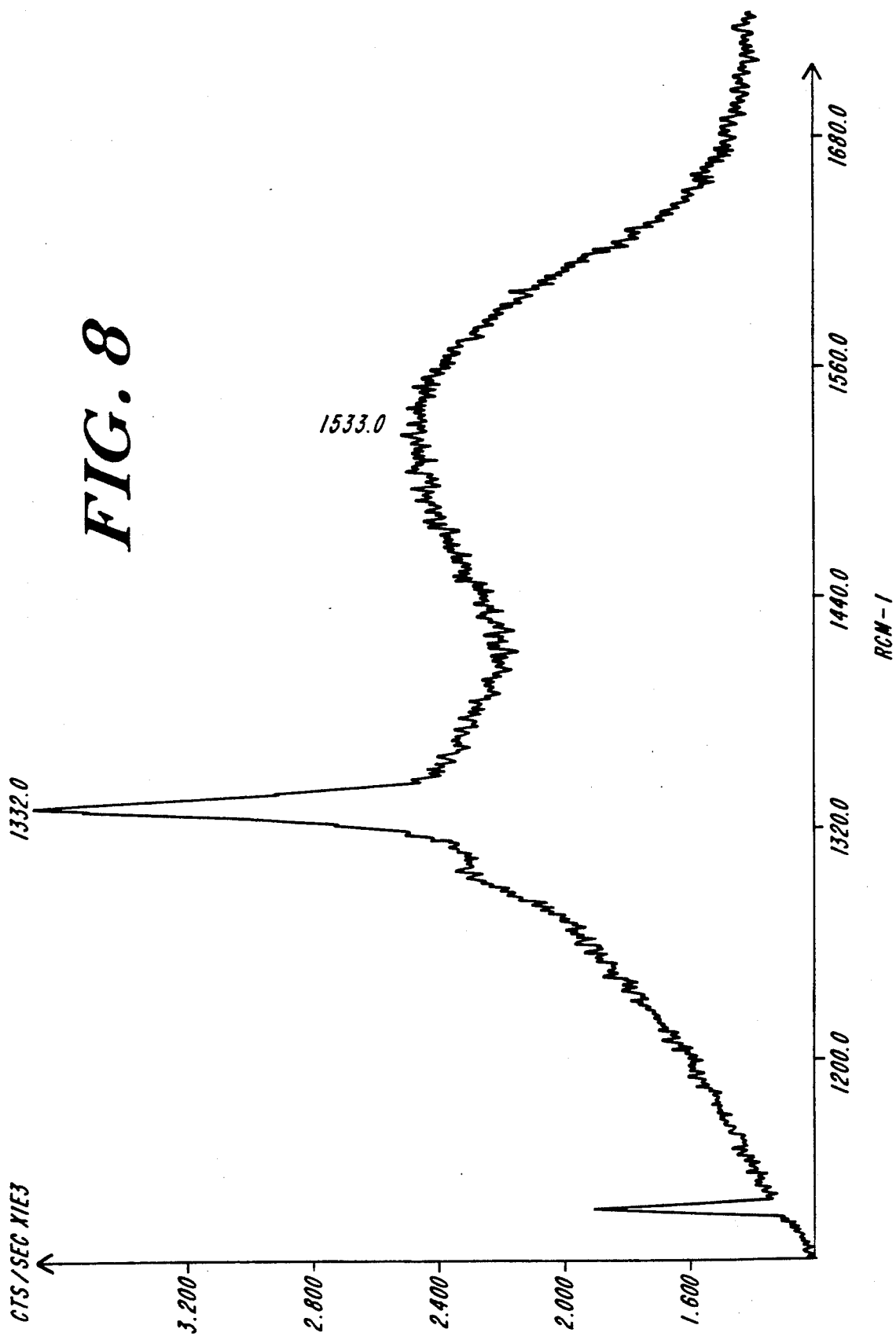
FIG. 8 is a Raman microprobe spectrum of a diamond crystal grown according to the present invention.

FIGS. 5 through 7 each represent roughly 100 $\mu m$ wide square fields of an identical substrate 34 upon which a diamond film 36 has been grown. FIGS. 5 and 6 represent areas of the substrate in which diamond crystals 38 have been grown upon seeded craters (not shown) of the type illustrated in FIG. 3. The craters from which the crystals 38 of FIGS. 5 and 6 have been grown are arranged in an orthogonal pattern. However, the craters of FIG. 6 are spaced more closely together than those in FIG. 5. FIG. 7 represents an area of film growth 36 from the same substrate 34 shown in FIGS. 5 and 6, in which the craters (not shown) are arranged in a hexagonal pattern. FIGS. 5 through 7 also contain minimal qualities of spurious crystals 32.

The diamond crystals 38 of FIG. 5 are approximately 2 to 3 microns in diameter with 5 microns separating the centers of each crystal. The density of crystals shown in this FIG. is $4.0 \times 10^6$ crystals per $cm^2$.

Diamond crystals 38 of FIG. 6, as noted above, are grown upon seeded craters spaced more closely than those of FIG. 5. The centers of each of the crystals 38 are separated by about 3 microns. The diameter of the crystals 16 in FIG. 5 is about 3 microns and the crystal density is $1.1 \times 10^7$ crystals per $cm^2$.

FIG. 7 represents an area of continuous, substantially smooth diamond film 36 in which the craters upon which the individual crystals 38 are grown are arranged in a hexagonal pattern. In such a pattern, each crater (not shown) is circumferentially surrounded by six equally spaced craters, each of which is spaced by a radial distance of about 0.6 micron from a central crater. The diamond film 36 of FIG. 7 is comprised of a multitude of individual diamond crystals 38 which have coalesced to form a continuous film. The density of crystals in this film is $3.3 \times 10^8$ crystals per $cm^2$. This film is of particularly good surface quality and its surface morphology, regularity and crystal density are likely to be sufficient for a number of useful applications, such as in semiconductor devices and laser optics.

FIGS. 5 through 7 clearly illustrate diamond films grown in highly ordered and controllable patterns. The size of the individual diamond crystals is substantially uniform, as is the spacing (if any) between the crystals. Moreover, the pattern of crystals as well as the spacing between the crystals may be predetermined and controlled depending upon requirements of a given application. Hexagonally arranged crater patterns may well be preferred over orthogonal patterns as the crystals more readily grow to fill the substantially circular (hexagonal) spaces between craters in hexagonal patterns as opposed to square spaces in orthogonal patterns. On the other hand, if there is no need for the crystals of a film to coalesce, orthogonal patterns may be preferred. In any event, it is understood that a variety spacing patterns may be used in addition to those described herein to achieve equal or better results.

The following non-limiting examples serve to further describe the invention.

EXAMPLE I

A conventional polished silicon substrate wafer having dimensions of approximately 1 cm × 1 cm was obtained. Using a Micrion 808 FIB unit available from Micrion Corporation of Beverly, Mass., craters were formed in the substrate in an orthogonal pattern with approximately 1 micron spacing between craters (measured from center to center). The craters were approximately 0.1 $\mu$m in diameter and 0.2 $\mu$m in depth. The craters were formed with the Micrion 808 unit using a 25 keV Ga+ beam at a dose of 0.16 nanocoulomb/$\mu^2$. Following cratering, the substrate was cleaned by immersion for two minutes in an ultrasonic cleaning bath containing acetone and then for 5 minutes in an ultrasonic bath of isopropyl alcohol.

The craters were then seeded by applying to the cratered surface of the substrate a sufficient amount of a suspension containing minute diamond seed particles to completely cover the surface of the substrate. The suspension contained approximately 0.2 grams of 0 to 0.25 micron grain diameter General Electric #300S synthetic diamond particles dispersed in about 100 ml of isopropyl alcohol. Subsequently the substrate was gently agitated for several minutes and was once again covered with the suspension. The substrate was then flushed with isopropyl alcohol and was placed in the ultrasonic isopropyl alcohol bath for 10 seconds. This seeding process was repeated three additional times. The substrate was then scrubbed with cotton swabs saturated in an isopropyl alcohol solution to remove spurious seed particles.

The substrate was then subjected to a filament-assisted CVD process to form a diamond film upon the substrate. The substrate was placed on a boron nitride plate disposed within a quartz tube which, in turn, was housed within a furnace heated to 825° C. The substrate was spaced approximately 6 mm from a 0.010 mm spiral filament constructed of tungsten, through which an 8 amp current was passed. A high purity mixture of 3.4% methane gas diluted with about 96.6% hydrogen gas was introduced to the tube so that the gas mixture passed over the filament and substrate at 28.5 sccm and 1.0 sccm, respectively. Deposition was allowed to continue for 3 hours, 45 minutes.

The substrate was removed from the deposition apparatus. A scanning electron micrograph was made of a representative field (approximately 100 $\mu$m wide) of the resultant film. The photograph, shown in FIG. 4, has diamond crystals approximately 3 microns in diameter which were present in a density of about $1.1 \times 10^7$ per cm$^2$ and were almost coalesced.

EXAMPLE II

The substrate preparation procedure of Example I was followed, except that one area (area A) of the substrate had formed therein 0.1 $\mu$m diameter craters in an orthogonal pattern with 5 micron spacing between craters. Another area (area B) had formed therein 0.1 $\mu$m diameter craters in an orthogonal pattern with 3 micron spacing between craters. Another area (area C) had formed therein 0.1 $\mu$m diameter craters arranged in a hexagonal pattern with 0.6 micron radial spacing between craters.

A seeding process substantially the same as that of Example I was followed.

The substrate was subjected to a filament-assisted CVD diamond film growth process of the type explained in Example 1. The deposition parameters were as follows:

| | |
|---|---|
| Furnace temperature: | 845 degrees C. |
| Filament current: | 8.0 amps |
| Filament-sample spacing: | 8 mm |
| Hydrogen flow: | 28.5 sccm |
| Methane flow: | 1.0 sccm |
| Hydrogen/methane ratio: | 96.6/3.4 |
| Pressure | 77 mB |
| Deposition time: | 2 hrs. 30 mins. |

Following deposition, the substrate was removed and photomicrographs of representative 100 $\mu$m wide fields were made of each of areas A, B and C. The photograph of area A is shown as FIG. 5, that of area B is shown as FIG. 6, and that of area C is shown as FIG. 7. FIGS. 5 through 7 reveal that areas A, B and C featured quality diamond film growth in a regular and predetermined pattern. Area A had an orthogonal diamond crystal pattern with crystals of about 3 microns in size and a density of about 1 crystal per 25 $\mu$m$^2$. Area B had a regular orthogonal pattern with crystals of about 3 microns in diameter and a density of about 1 crystal per 9 $\mu$m$^2$. Area C had diamond crystals grown in a hexagonal pattern such that the crystals coalesced, a density of 1 crystal per 0.3 $\mu$m$^2$.

EXAMPLE III

A single crystal of diamond film, grown by a process substantially the same as that described in Examples I and II was analyzed using Raman Spectroscopy with excitation by means of the 514.5 nm line of an argon ion laser at a power of 80 mw.

The results of the spectroscopy are illustrated in FIG. 7 which plots the intensity of the Raman scattered light at various wavelengths. The sharp peak which appears at 1332.0 cm$^{-1}$ is indicative of quality diamond film. (The peak at 1122.0 cm$^{-1}$ is a mercury line which results from overhead lights in use during the spectroscopy.)

What is claimed is:
1. A method of forming a diamond film on a non-diamond substrate, comprising the steps of:
 preparing a surface of a substrate for diamond film deposition by introducing to the surface of the substrate a plurality of minute surface irregularities in a predetermined pattern;

applying at least one diamond seed particle within the irregularities, the seed particles having dimensions smaller than the irregularities; and depositing a diamond film on the surface of the substrate.

2. The method of claim 1 wherein the diamond film is polycrystalline.

3. The method of claim 2 wherein the surface irregularities are craters.

4. The method of claim 3 wherein the diamond film is comprised of crystals arranged in a predetermined pattern substantially corresponding to the cratering pattern.

5. The method of claim 4 wherein the diamond crystals coalesce to form a continuous film.

6. The method of claim 4 wherein the diamond film comprises a non-continuous film formed by a plurality of discrete crystals.

7. The method of claim 1 wherein the substrate is a single crystal silicon wafer.

8. The method of claim 3 wherein the craters are formed by focused ion beam milling.

9. The method of claim 3 wherein the craters are formed by laser vaporization.

10. The method of claim 3 wherein the craters are formed by chemical or plasma etching using a patterned photoresist.

11. The method of claim 3 wherein the craters range in diameter from about 0.05 to about 10 $\mu$m.

12. The method of claim 3 wherein the craters are formed in the substrate at a density ranging from about $10^4$ to about $10^{10}$ craters per cm$^2$.

13. The method of claim 3 wherein the craters are seeded by applying to the cratered surface of the substrate a liquid within which is suspended fine diamond seed particles ranging in size from about 0.001 to 0.5 $\mu$m.

14. The method of claim 13 where in the diamond seed particles are selected from the group consisting of natural and synthetic diamond.

15. The method of claim 13 wherein the liquid is selected from the group consisting of alcohols, soaps, oils and water.

16. The method of claim 13 wherein the liquid is an aqueous solution.

17. The method of claim 1 wherein the diamond film is deposited using a filament-assisted chemical vapor deposition technique.

18. The method of claim 1 wherein the step of applying a diamond seed to the irregularities further includes the step of applying to the irregularity-containing substrate surface a liquid having dispersed therein fine diamond particles.

19. The method of claim 18 further including the step of removing liquid from the substrate surface.

20. The method of claim 18 further including the step of removing any excess of diamond particles which are not disposed in irregularities from the surface of the substrate.

21. A method of forming a polycrystalline film on a foreign substrate, comprising the steps of:

preparing a surface of a substrate for film deposition by introducing in the surface of the substrate a plurality of surface irregularities in a predetermined pattern;

seeding the surface irregularities with a fine film precursor material to define film growth initiation sites, said film precursor material being identical to the film and having dimensions sufficiently small to fit within the irregularities; and depositing a film on the surface of the substrate.

22. A diamond-coated product comprising a substrate and a synthetic, polycrystalline diamond coating formed by a plurality of individual diamond crystals secured to at least a portion of the substrate, wherein the crystals which comprise the film are present on the substrate at a density ranging from about $10^4$ to about $10^{10}$ crystals per square centimeter and said crystals are formed on the substrate by creating a predetermined pattern of irregularities in the surface of the substrate, seeding the irregularities with a diamond seed material, and growing diamond crystals from the seed material by deposition.

23. The diamond film of claim 22 wherein the crystals range in size from about 0.1 to about 100 $\mu$m.

24. The diamond film of claim 23 wherein the crystals are discrete and are spaced apart from each other by a distance ranging from about less than 0.1 to about 100 $\mu$m.

25. The diamond film of claim 23 wherein the crystals coalesce to form a continuous film with a regular structure substantially free of voids.

26. The product of claim 22 wherein the substrate is an electrically conductive substrate.

27. The product of claim 22 wherein the substrate is an electrically insulating substrate.

28. The product of claim 22 wherein the substrate is a semiconductor material substrate.

29. The product of claim 22 wherein the substrate comprises a tool.

30. The product of claim 22 wherein the substrate is a transparent substrate.

31. A method of forming a diamond lens product, comprising the steps of:

preparing a surface of a substrate for diamond film deposition by introducing into the surface of the substrate a plurality of minute surface irregularities in a predetermined pattern;

applying at least one diamond seed particle within the irregularities, the seed particles having dimensions smaller than the irregularities; and depositing an optical quality diamond film on the surface of the substrate.

32. The method of claim 31 further comprising the step of separating the diamond film from the substrate.

33. A diamond lens product prepared according to the method of claim 31.

* * * * *